United States Patent [19]

Nishiyama

[11] Patent Number: 5,103,272
[45] Date of Patent: Apr. 7, 1992

[54] SEMICONDUCTOR DEVICE AND A METHOD FOR MANUFACTURING THE SAME

[75] Inventor: Akira Nishiyama, Kawasaki, Japan

[73] Assignee: Kabushiki Kaisha Toshiba, Kawasaki, Japan

[21] Appl. No.: 496,226

[22] Filed: Mar. 20, 1990

[30] Foreign Application Priority Data

Apr. 3, 1989 [JP] Japan .................................. 1-81430

[51] Int. Cl.⁵ ...................... H01L 21/28; H01L 21/88
[52] U.S. Cl. .................. 357/23.4; 357/23.1; 357/41; 357/23.6
[58] Field of Search ...................... 357/23.4, 23.6, 23.9

[56] References Cited

U.S. PATENT DOCUMENTS

| | | | |
|---|---|---|---|
| 4,784,973 | 11/1988 | Stevens et al. | 437/239 |
| 4,873,557 | 10/1989 | Kita | 357/23.1 |
| 4,922,311 | 5/1990 | Lee et al. | 357/23.1 |
| 4,923,822 | 5/1990 | Wang et al. | 357/23.1 |
| 4,949,136 | 8/1990 | Jain | 357/23.4 |

FOREIGN PATENT DOCUMENTS

| | | | |
|---|---|---|---|
| 58-219770 | 12/1983 | Japan . | |
| 60-88476 | 5/1985 | Japan . | |
| 62-111466 | 5/1987 | Japan . | |
| 63-204743 | 8/1988 | Japan | 357/23.4 |

OTHER PUBLICATIONS

"New Schemes to Form Shallow N+ and P+ Junctions for MOS Devices", IBM TDB, vol. 28, No. 1, Jun. 1985, pp. 366-367.
IEDM Tech. Dig., "Novel Submicron MOS Devices by Self-Aligned Nitridation of Silicide", H. Kaneko et al., Dec. 1985, pp. 208-211.
Proc. IEEE VMIC, "A One Step Annealing for Dopants Activation, Silicide Resistivity Lowering and Glass Flow by Rapid Thermal Processing", D. Gloesener et al., Jun. 13, 1988, pp. 43-50

Primary Examiner—Andrew J. James
Assistant Examiner—Viet Q. Nguyen
Attorney, Agent, or Firm—Oblon, Spivak, McClelland, Maier & Neustadt

[57] ABSTRACT

A MOS transistor has a gate electrode, a source region and a drain region formed on a substrate. A titanium silicide film is formed above the gate electrode and the source and drain regions. A titanium nitride layer whose melting point is higher than that of the silicide film is formed between the substrate and the titanium silicide film. The nitride layer prevents the silicide film from agglomerating during the thermal treatment in a manufacturing process. The nitride layer is formed by implanting nitrogen ions into the silicide film and performing and annealing treatment.

6 Claims, 5 Drawing Sheets

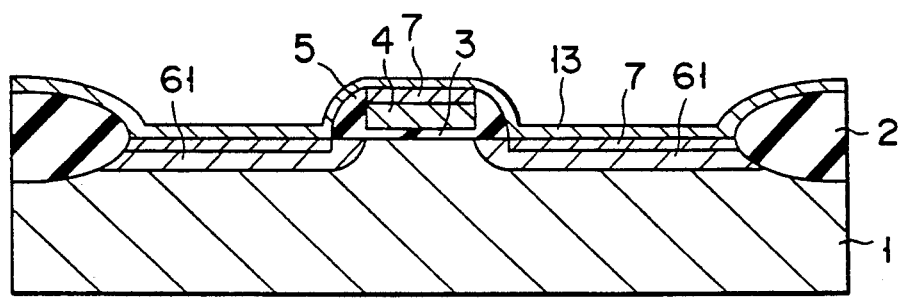
F I G. 3C
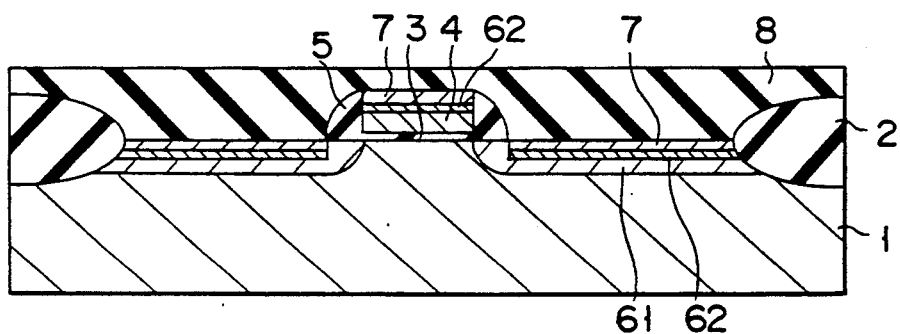
F I G. 3D
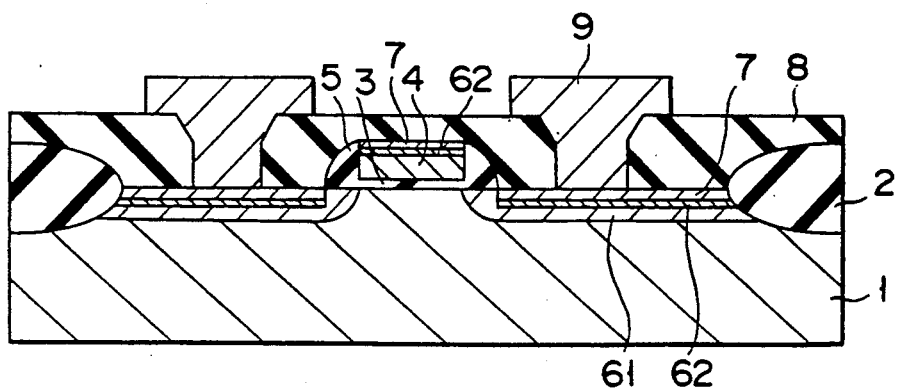
F I G. 3E

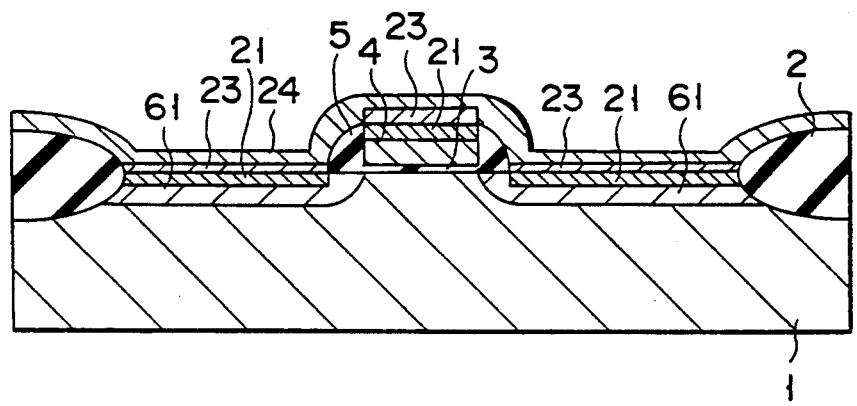
F I G. 4D
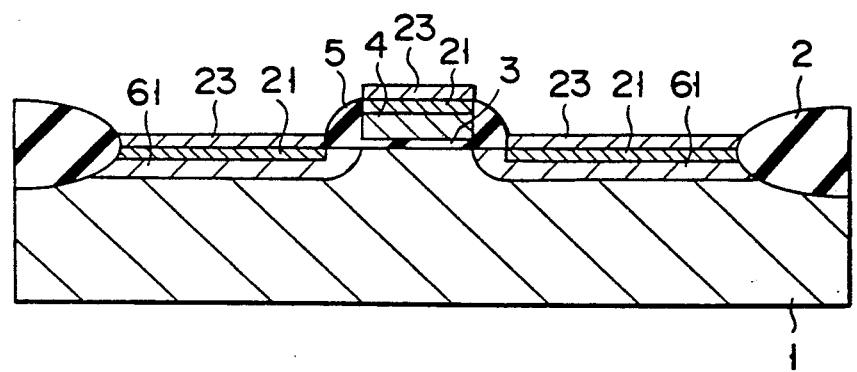
F I G. 4E

SEMICONDUCTOR DEVICE AND A METHOD FOR MANUFACTURING THE SAME

BACKGROUND OF THE INVENTION

1. Field of the Invention

The present invention relates to a semiconductor device and a method for manufacturing the same and more particularly, to a structure of a MOS transistor having a metal silicide film formed on a source and a drain region and a method for manufacturing the MOS transistor.

2. Description of the Related Art

Miniaturization and high integration of a MOS transistor using a silicon substrate have been remarkably developed. Since the miniaturization makes a small contact hole through which a metal wiring layer and the source/drain region is connected, a contact resistance between them tends to increase. The miniaturization also makes the source/drain region shallow and thus a sheet resistance of each region increases. The increase in these resistances causes the current driving force of the MOS transistor to decrease and causes the speed thereof to decrease.

To solve the above-mentioned problem, it is well-know to form a metal silicide film on the source/drain region. A process of manufacturing a MOS transistor using the metal silicide is illustrated in FIGS. 1A through 1C.

For example, in an n-channel MOS transistor, gate oxide film 32 and polysilicon gate electrode 33 are formed on p-type silicon substrate 31. $SiO_2$ film 34 is formed on the side wall of gate electrode 33 by CVD chemical Vapor Deposition $SiO_2$ film, followed by reactive ion etching.

For example, arsenic (As) is ion-implanted into p-type silicon substrate 31 and then a thermal treatment is performed at 900° C. for an hour to form n-type impurity diffusion layers, i.e., source and drain regions 35 and 36. Ti film 37 is deposited on the entire surface of the MOS transistor. (FIG. 1A)

Subsequently, a lamp annealing treatment is performed at 700° C. for thirty seconds to convert Ti film 37 into $TiSi_2$ film 38 on the source and the drain region and the gate electrode. $TiSi_2$ film 38 is relatively thin and its thickness is about 300 to 700 Å. If $TiSi_2$ film 38 were to be to thick, unnecessary $TiSi_2$ film could be formed on $SiO_2$ film 34, resulting in a short circuit between the source/drain region and the gate electrode. The other reason is that $TiSi_2$ film 38 needs to be much thinner than the source and the drain region. Unreacted Ti film 37 is then eliminated by an etching liquid containing hydrogen peroxide, and the lamp annealing treatment is performed again at about 900° C., thereby sufficiently lowering the resistivity of $TiSi_2$ film 38. (FIG. 1B).

BPSG film 39 containing a large quantity of boron and phosphorus is formed on the entire surface of the MOS transistor, and film 39 is fluidized at a high temperature of about 900° C. and its surface is flattened. FIG. 1C)

In the foregoing method of manufacturing the n-channel MOS transistor, the $TiSi_2$ film 38 agglomerates, and its surface becomes uneven during the thermal treatment performed at a temperature of around 900° C. For this reason, some portions of the source/drain region between a PN junction and the $TiSi_2$ film are thin. A leak is likely to occur in the junction during the operation of the transistor, and thus the characteristic of the transistor is degraded. Due to the contraction of the $TiSi_2$ film, the distance (indicated by "L" in FIG. 1C) between the $TiSi_2$ film and a channel region increases, inevitably increasing the parasitic resistance of the MOS transistor.

In a p-channel MOS transistor in which a source and a drain region are formed by diffusing boron (B), there occurs the following problem in addition to the above problem. In the thermal treatment step mentioned above, boron in a p+ diffusion layer serving as the source or the drain region is diffused into the $TiSi_2$ film. Thus, the boron concentration at the interface between the $TiSi_2$ film and the p+ diffusion layer is lowered and contact resistance is increased. Furthermore, the boron taken into the $TiSi_2$ film is retreated when the $TiSi_2$ film contracts, and the concentration of the boron within the distance L is lowered and the parasitic resistance is increased.

As mentioned above, the MOS transistor in which the metal silicide film or layer is formed on the source and the drain region has a drawback in that the metal silicide film is poor in heat resistance and it contracts in the step of reflowing the BPSG film, resulting in degradation of the reliability of the semiconductor device. Furthermore, the p-channel MOS transistor has a drawback in that the contact resistance at the interface between the $TiSi_2$ layer and the p+ diffusion layer and the parasitic resistance are likely to increase and the current driving force is reduced, resulting in a decrease in the operation speed of the device.

SUMMARY OF THE INVENTION

It is therefore an object of the present invention to provide a MOS transistor having a metal silicide layer formed on a source/drain region, which has an improved reliability by preventing the silicide layer from agglomerating during a thermal treatment.

It is another object of the present invention to provide a p-channel MOS transistor having a metal silicide layer formed on a source/drain region, which can keep the grade of performance by preventing boron in a p+ diffusion layer serving as the source/drain region from diffusing into the metal silicide layer during a thermal treatment step.

A semiconductor device according to the present invention comprises a gate electrode, a source region and a drain region formed on a semiconductor substrate, a metal silicide layer formed above each of the source and the drain region, and a metal nitride layer formed between each of the regions and the metal silicide layer.

A first method of manufacturing a semiconductor device according to the present invention comprises the steps of forming a gate electrode, a source region and a drain region on a semiconductor substrate, depositing a metal film above each of the source and the drain region, converting the metal film into a metal silicide film, and converting a part of the metal silicide film which is close to the source and the drain region into a metal nitride layer.

A second method of manufacturing a semiconductor device according to the present invention comprises the steps of forming a gate electrode, a source region and a drain region on a semiconductor substrate, forming a metal silicide film above each of the source and the drain region, nitriding the metal silicide film to be converted into a nitride film including silicon crystallite, depositing a metal film on the nitride film, and annealing the metal film to at least partially convert the metal film into a metal silicide film by using said silicon crystallite.

According to the present invention, since a metal nitride layer having a high melting point is formed between each of the source and the drain region and the metal silicide film, the metal silicide film does not contract even if a thermal treatment is performed at a high temperature. The nitride film suppresses the diffusion of boron into the silicide film. For this reason, the parasitic resistance of the MOS transistor and the contact resistance between the source/drain region and the metal silicide film can be lowered, thereby achieving a great current driving force and a high operation speed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIGS. 3A to 3E are cross-sectional views showing the steps of manufacturing the MOS transistor shown in FIG. 2; and FIGS. 4A to 4E are cross-sectional views showing other steps of manufacturing the MOS transistor according to the present invention.

DETAILED DESCRIPTION OF THE PREFERRED EMBODIMENTS

Figure 1A:
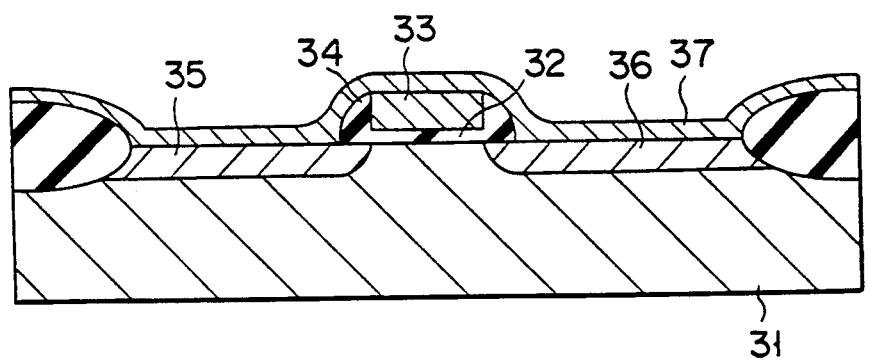
FIGS. 1A to 1C are cross-sectional views showing the steps of manufacturing a conventional MOS transistor using metal silicide.
Figure 1B:
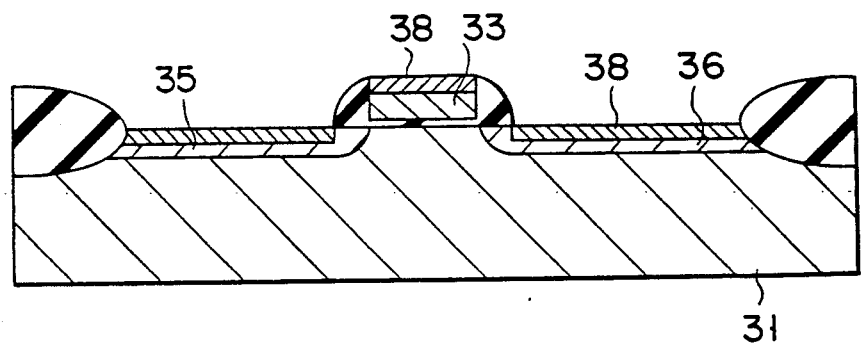
Figure 1C:
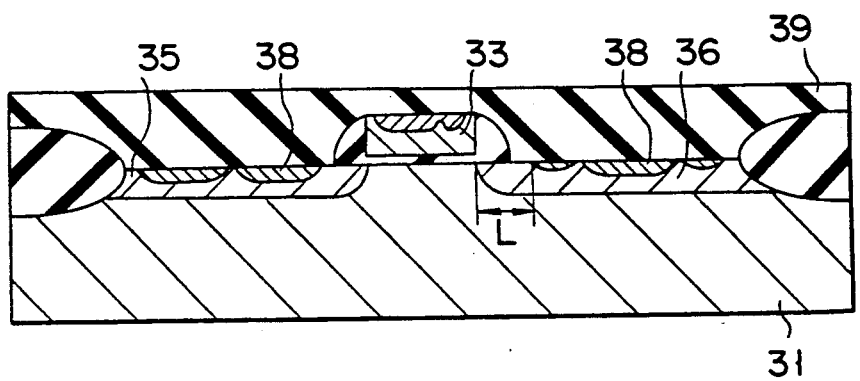
Figure 2:
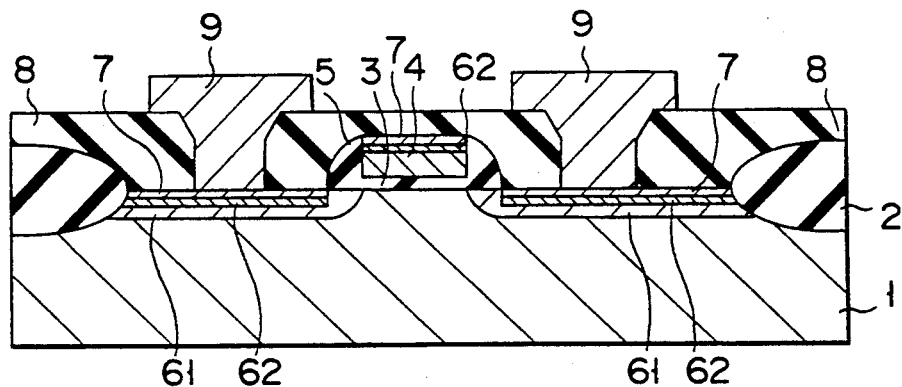
FIG. 2 is a cross-sectional view showing a structure of a MOS transistor according to an embodiment of the present invention.

FIG. 2 is a cross-sectional view showing a semiconductor device according to an embodiment of the present invention. Element isolation region 2 is formed on n-type silicon substrate (or n-type well) 1 by a selective oxidation method or the like, providing an element formation region therewith. Gate oxide film 3 is formed in a predetermined position of the element forming region on substrate 1, and on gate oxide film 3 is a conductive film, e.g., gate electrode 4 constituted of polysilicon into which phosphorus is doped at a high concentration. Sidewall insulating film 5 constituted of, for example, a LP-CVD SiO$_2$ film is formed on the sides of gate electrode 4. P-type source and drain region 61 and 61 into which boron is doped, extend from an end of gate electrode 4 in substrate 1 to element isolation region 2. TiN layer 62 and TiSi$_2$ film 7 whose resistivity is lower than the TiN layer, are sequentially formed on source/drain region 61 and gate electrode 4. Further, an SiO$_2$ film containing a large amount of boron and phosphorus, i.e., BPSG film 8 is formed to flatten the surface of the element. A contact hole and electrode 9 composed of Al are provided in a predetermined position on TiSi$_2$ film 7 on source/drain region 61.

FIGS. 3A to 3E are cross-sectional views showing the steps of manufacturing the MOS transistor shown in FIG. 2.

Figure 3A:
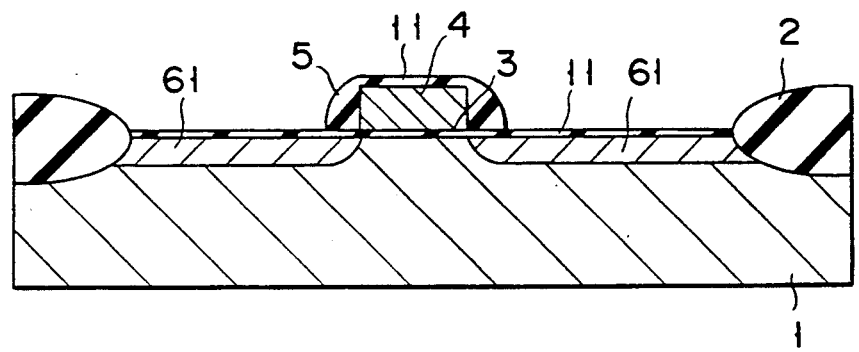

Element isolation region 2 is formed on n-type silicon substrate (or n-type well) 1 by a selective oxidation method or the like. Gate oxide film 3 having a thickness of about 200 Å is formed in the element forming region of substrate 1 and then a polysilicon film for the gate electrode is formed on the entire surface of the wafer. After the sheet resistance of the polysilicon is lowered to several tens of Ω/ by diffusing phosphorus, the polysilicon film is processed so as to have a width of 1.0 μm by using a photoresist as a mask, thereby obtaining gate electrode 4. An SiO$_2$ film is deposited by 1500 Å on the entire surface of the wafer by the CVD method and it is etched using a reactive ion etching method to leave sidewall insulation film 5 only on the sides of gate electrode 4. Subsequently, BF$_2$ particles are implanted at an acceleration voltage of 40 KeV and at a dose of $5 \times 10^{15}$ cm$^{-2}$ and the wafer is subjected to an annealing treatment at 900° C. for half an hour, thereby forming source/drain region 61. During the annealing treatment, SiO$_2$ film 11 having a thickness of about 400 Å is formed on source/drain region 61 and on gate electrode 4 (FIG. 3A).

Figure 3B:
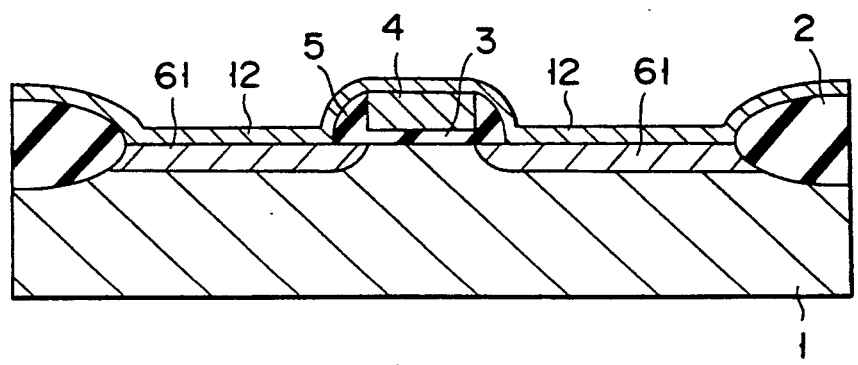

SiO$_2$ film 11 formed on source/drain region 61 and on gate electrode 4, is removed by etching using a dilute HF solution. Then, Ti film 12 is deposited on the entire surface of the wafer by the sputtering technique (FIG. 3B).

The wafer is subjected to a lamp annealing treatment at 750° C. for thirty seconds in a nitrogen atmosphere to cause Ti film 12 to react with Si in the substrate. Thus alloyed TiSi$_2$ film 7 having a thickness of about 700 Å is formed on source/drain region 61 and on gate electrode 4. During the annealing treatment, mixed film 13 containing Ti and N is formed by the nitriding reaction of the surface of Ti film 12 (FIG. 3C).

Mixed film 13 formed on Ti film 12 is etched by a solution including aqueous ammonia and hydrogen peroxide and then an annealing treatment is performed at 900° C. for twenty seconds in the nitrogen atmosphere thereby to lower the resistivity of TiSi$_2$ film 7 to about 20 μΩ·cm. Nitrogen is ion-implanted into the entire surface of the wafer at an acceleration voltage of 40 KeV and at a dose of $5 \times 10^{16}$ cm$^{-2}$. Then the wafer is subjected to an annealing treatment at 900° C. for twenty seconds in an Ar atmosphere to remove the damage of the implanting. As a result, a half part of TiSi$_2$ film 7, which is close to the interface with source/drain region 61 and gate electrode 4, becomes a nitrogen implanted layer. A SiO$_2$ film including a large amount of boron and phosphorus, i.e., BPSG film 8 is deposited to a thickness of about 1 μm on the entire surface of the wafer by the CVD method, and an annealing treatment is performed at 900° C. for an hour in POCl$_3$ to flatten the surface of BPSG film 8. The above-mentioned anneal treatment for lowering the resistivity of TiSi$_2$ film 7 can be performed at the time of the annealing treatment of BPSG film 8. TiN layer 62 is formed as a compound at the same time when BPSG film 8 is flattened (FIG. 3D).

If the acceleration voltage is controlled when nitrogen is ion-implanted, the depth of the ion implantation can be controlled so that the depth does not reach the source and the drain junction or the gate oxide film. This is effective in eliminating an adverse influence on source and drain regions 61 and gate electrode 4.

Finally, after a contact hole is formed in BPSG film 8, for example, Al film having a thickness of 8000 Å is deposited on the entire surface of the wafer by the sputtering technique, and patterned to form electrode 9 (FIG. 3E). Thus, the MOS transistor according to the present invention, as shown in FIG. 2, is completed.

FIGS. 4A to 4E are cross-sectional views showing other steps of manufacturing the MOS transistor according to the present invention.

Figure 4A:
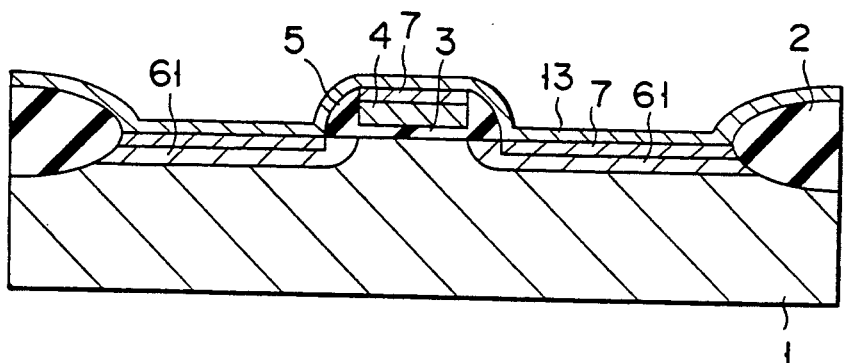

FIG. 4A shows the same structure as that of FIG. 3C and the explanation of steps of manufacturing the condition shown in FIG. 4A is identical with that of the manufacturing steps shown in FIGS. 3A to 3C.

Figure 4B:
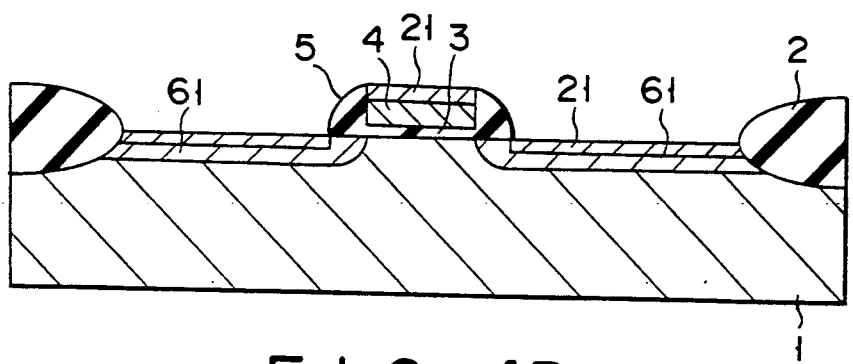

First, mixed film 13 containing Ti and N formed on the surface of a wafer is removed by etching by a solution including aqueous ammonia and hydrogen peroxide and $TiSi_2$ film 7 of about 300 Å in thickness remains on the source/drain region and the gate electrode. Nitrogen is ion-implanted onto the entire surface of the wafer on an acceleration voltage of 20 keV and at a dose of $3 \times 10^{16}$ cm$^{-2}$ and an anneal treatment is performed at 900° C. for ten minutes in the $N_2$ atmosphere, thereby converting $TiSi_2$ film 7 into TiN film 21 (FIG. 4B). TiN film 21 includes silicon crystallite. Even if the wafer is annealed at 1000° C. for twenty seconds in the ammonia atmosphere instead of ion-implantation of nitrogen, $TiSi_2$ film 7 can be converted into TiN film 21.

Figure 4C:
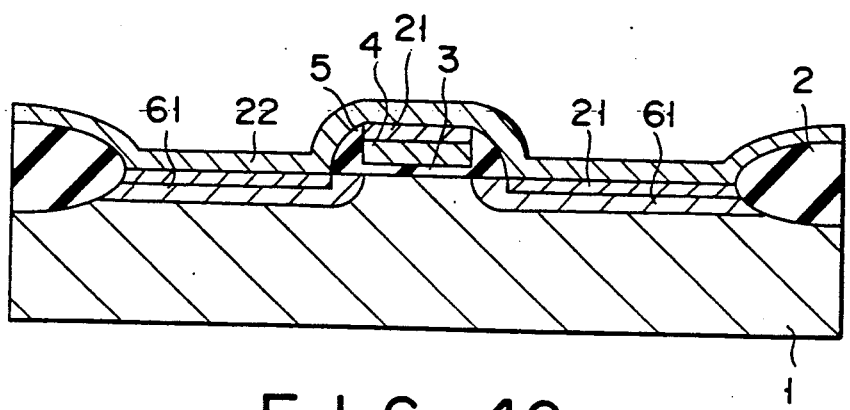

Ti film 22 is then deposited to a thickness of around 400 Å on the entire surface of the wafer by the sputtering technique (FIG. 4C).

Next, the wafer is subjected to the annealing treatment at 750° C. for thirty seconds in the nitrogen atmosphere to form $TiSi_2$ film 23 having a thickness of about 300 Å from the lowest portion of Ti film 22. The remaining upper portion of Ti film 22 becomes mixed film 24 of TiN and Ti (FIG. 4D).

Mixed film 24 is then removed by etching by a mixed solution of aqueous ammonia and hydrogen peroxide to expose $TiSi_2$ film 23. The wafer is subjected to the annealing treatment at 900° C. for twenty seconds in the nitrogen atmosphere to lower the resistivity of $TiSi_2$ film 23 down to about 20 $\mu\Omega$·cm (FIG. 4E).

After the structure shown in FIG. 4E is obtained, the wafer is treated in accordance with the same steps as shown in FIGS. 3D to 3E. More specifically, as shown in FIG. 3D, a BPSG film of about 1 $\mu$m in thickness is deposited on the entire surface of the wafer, and the wafer is annealed at 900° C. for an hour in the $POCl_3$ to flatten the surface of the BPSG film. The annealing treatment for lowering the resistivity of $TiSi_2$ film 23, mentioned in the description of the manufacturing step shown in FIG. 4E, can be performed at the time of the treatment of the BPSG film, so that it can be omitted from the step shown in FIG. 4E. Finally, electrode 9 as shown in FIG. 3E is formed and thus a MOS transistor according to the present invention is completed.

According to this second method of manufacturing the MOS transistor, when $TiSi_2$ film 23 is formed on TiN film 21, silicon crystallite included in TiN film 21 is consumed and silicon in source/drain region 61 is not consumed. It is therefore effective for controlling the formation of source/drain region 61 in particular when region 61 is thin.

In the above-mentioned two methods of manufacturing a MOS transistor, TiN layer 62, of the first embodiment, or 21, of the second embodiment, which is stable against the thermal treatment at about 900° C., is formed between $TiSi_2$ film 7 or 23 and source/drain region 61. Therefore, $TiSi_2$ film 7 or 23 may not contract and may not move away from a channel, thereby preventing the parasitic resistance of the MOS transistor from increasing. Since TiN layer 62 or 21 suppresses the diffusion of boron into $TiSi_2$ film 7 or 23, a low contact resistance between $TiSi_2$ film 7 or 23 and source 61 through TiN layer 62 or 21 can be achieved. Therefore, the current driving force of the element is not reduced and the operation speed of the element is not decreased.

The present invention has been described in accordance with the preferred embodiments shown in the attached drawings. It is however evident that various changes and modifications can be made without departing from the scope and spirit of the present invention.

In the aforementioned embodiment, for example, the $TiSi_2$ film is used as a metal silicide film. Cobalt silicide, nickel silicide, molybdenum silicide, tungsten silicide or the like can also be used for the silicide film. The conditions of nitriding such as ion-implantation of nitrogen depend on these metal silicides. As an electrode, tungsten or molybdenum can be used in place of aluminum.

The metal silicide layer can also be formed by the selective CVD technique.

In the above embodiments, a p-channel MOS transistor is explained. However, the present invention can be applied to an n-channel MOS transistor and a CMOS transistor. In the n-channel MOS transistor, a p-type silicon substrate can be used and arsenic or phosphorus may be used as source and drain impurities.

In the above embodiments, a metal nitride layer and a metal silicide film are formed on the gate electrode and the source and the drain region. However, they can be formed on only the source and the drain region by using a patterning mask on the gate electrode.

What is claimed is:

1. A semiconductor device comprising:
   a gate electrode, a source region and a drain region formed on a semiconductor substrate;
   a metal silicide layer formed above said source region and said drain region; and
   a metal nitride layer formed between said source region and said metal silicide layer and between said drain region and said metal silicide layer, wherein the metal silicide layer completely covers the metal nitride layer.

2. The semiconductor device according to claim 1, wherein said metal nitride layer and said metal silicide layer have the same metal component.

3. The semiconductor device according to claim 1, wherein said metal nitride layer and said metal silicide layer are provided on said gate electrode.

4. The semiconductor device according to claim 2, wherein said metal component is titanium.

5. The semiconductor device according to claim 1, wherein said device is a P-channel MOS transistor.

6. The semiconductor device according to claim 1, wherein said metal nitride layer includes silicon crystallite.

* * * * *